(12) United States Patent
Hiraoka et al.

(10) Patent No.: US 10,739,019 B2
(45) Date of Patent: Aug. 11, 2020

(54) POWER CONVERSION DEVICE AND REFRIGERATION APPARATUS

(71) Applicant: DAIKIN INDUSTRIES, LTD., Osaka-shi, Osaka (JP)

(72) Inventors: Nobuyasu Hiraoka, Osaka (JP); Shinichi Ishizeki, Osaka (JP); Keito Kotera, Osaka (JP); Masahide Fujiwara, Osaka (JP)

(73) Assignee: DAIKIN INDUSTRIES, LTD., Osaka-Shi (JP)

( * ) Notice: Subject to any disclaimer, the term of this patent is extended or adjusted under 35 U.S.C. 154(b) by 0 days.

(21) Appl. No.: 16/617,700

(22) PCT Filed: May 25, 2018

(86) PCT No.: PCT/JP2018/020151
§ 371 (c)(1),
(2) Date: Nov. 27, 2019

(87) PCT Pub. No.: WO2018/221407
PCT Pub. Date: Dec. 6, 2018

(65) Prior Publication Data
US 2020/0112248 A1    Apr. 9, 2020

(30) Foreign Application Priority Data

May 30, 2017 (JP) .................................. 2017-106358

(51) Int. Cl.
*H02M 3/155* (2006.01)
*H02M 7/48* (2007.01)
(Continued)

(52) U.S. Cl.
CPC .............. *F24F 1/24* (2013.01); *F25B 31/006* (2013.01); *H02M 5/458* (2013.01); *H05K 1/0254* (2013.01); *H05K 1/0262* (2013.01)

(58) Field of Classification Search
CPC .. H02M 3/155; H02M 5/458; H02M 7/46–48; H02M 7/12; H05K 1/0262; H05K 1/0254
See application file for complete search history.

(56) References Cited

U.S. PATENT DOCUMENTS

2005/0189888 A1* 9/2005 Federman ............. F25B 49/025
318/67
2014/0104889 A1* 4/2014 Yamada ................ H02M 3/335
363/16

(Continued)

FOREIGN PATENT DOCUMENTS

CN    201336630 Y    10/2009
CN    104704733 A     6/2015
(Continued)

OTHER PUBLICATIONS

International Search Report, issued in PCT/JP2018/020151, PCT/ISA/210, dated Jul. 31, 2018.
(Continued)

*Primary Examiner* — Thienvu V Tran
*Assistant Examiner* — Sisay G Tiku
(74) *Attorney, Agent, or Firm* — Birch, Stewart, Kolasch & Birch, LLP.

(57) ABSTRACT

A converter, a first switch, a second switch, and an inverter are disposed in that order along a second direction, at a first position in a first direction. A reactor and a capacitor are disposed in that order along the second direction, at a second position in the first direction. Energy is stored in the reactor via the first switch. The capacitor is discharged via the second switch. At least one of a set of the reactor and the converter and a set of the capacitor and the inverter is disposed side by side along the first direction.

8 Claims, 5 Drawing Sheets

(51) Int. Cl.
  *F24F 1/24*    (2011.01)
  *H02M 7/12*    (2006.01)
  *H02M 5/458*   (2006.01)
  *H02M 5/46*    (2006.01)
  *H02M 5/48*    (2006.01)
  *F25B 31/00*   (2006.01)
  *H05K 1/02*    (2006.01)

(56) References Cited

U.S. PATENT DOCUMENTS

| | | | | |
|---|---|---|---|---|
| 2015/0082823 A1* | 3/2015 | Teraki | | H01L 23/473 |
| | | | | 62/259.2 |
| 2015/0114021 A1* | 4/2015 | Oguri | | H01L 23/473 |
| | | | | 62/259.2 |
| 2015/0128631 A1* | 5/2015 | Oguri | | H01L 23/473 |
| | | | | 62/259.2 |
| 2015/0236606 A1* | 8/2015 | Sakakibara | | H02M 5/40 |
| | | | | 363/37 |
| 2015/0244282 A1* | 8/2015 | Yamashita | | H02M 1/4225 |
| | | | | 363/35 |
| 2015/0276263 A1* | 10/2015 | Hayakawa | | F24H 3/022 |
| | | | | 392/360 |
| 2015/0280601 A1* | 10/2015 | Sakakibara | | H02M 1/15 |
| | | | | 363/37 |
| 2016/0248335 A1* | 8/2016 | Sakakibara | | H02M 1/4225 |
| 2016/0248365 A1* | 8/2016 | Ishizeki | | H02M 1/36 |
| 2016/0294300 A1 | 10/2016 | Sakakibara et al. | | |
| 2016/0330876 A1* | 11/2016 | Fujiwara | | H02M 1/42 |
| 2017/0201202 A1* | 7/2017 | Yamashita | | H02M 7/12 |
| 2017/0279372 A1* | 9/2017 | Sakakibara | | H02M 5/458 |
| 2017/0288567 A1* | 10/2017 | Taguchi | | F04B 49/20 |
| 2018/0007785 A1* | 1/2018 | Kamikura | | H02M 5/458 |
| 2018/0212510 A1* | 7/2018 | Takahashi | | H02J 2207/20 |
| 2018/0367080 A1* | 12/2018 | Ishizeki | | H02M 5/458 |
| 2018/0375455 A1* | 12/2018 | Ishizeki | | H02M 1/15 |
| 2019/0128555 A1* | 5/2019 | Takeda | | H02M 1/12 |
| 2019/0222135 A1* | 7/2019 | Sakakibara | | H02M 1/12 |

FOREIGN PATENT DOCUMENTS

| | | |
|---|---|---|
| CN | 105814374 A | 7/2016 |
| JP | 2014-96976 A | 5/2014 |
| JP | 2016-73025 A | 5/2014 |
| JP | 2015-84637 A | 4/2015 |
| JP | 2015-121364 A | 7/2015 |
| JP | 2016-109350 A | 6/2016 |

OTHER PUBLICATIONS

Written Opinion of the International Searching Authority, issued in PCT/JP2018/020151, PCT/ISA/237, dated Jul. 31, 2018.

* cited by examiner

F I G. 4
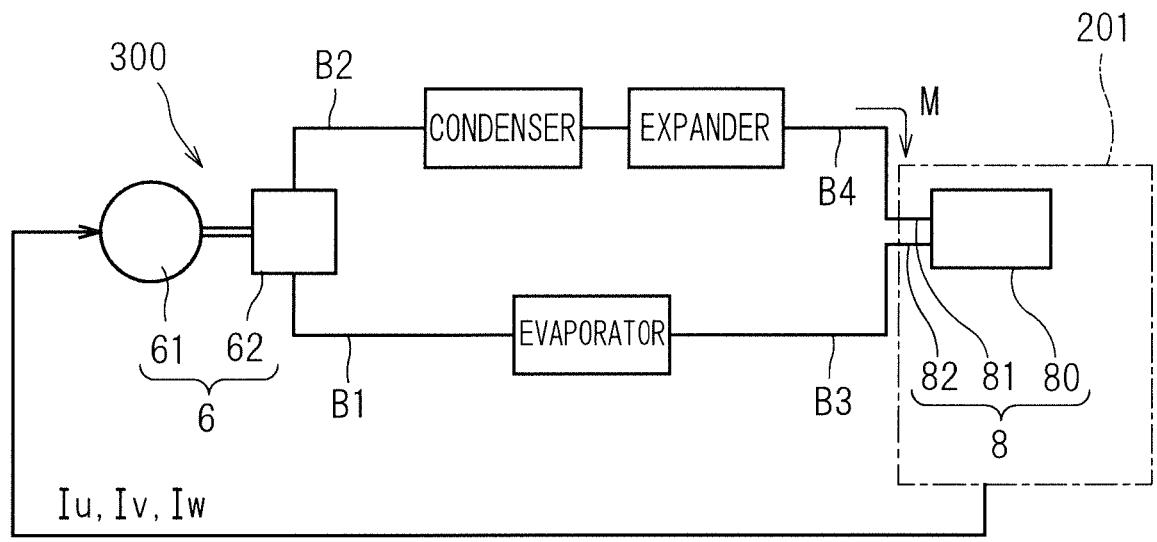
F I G 5
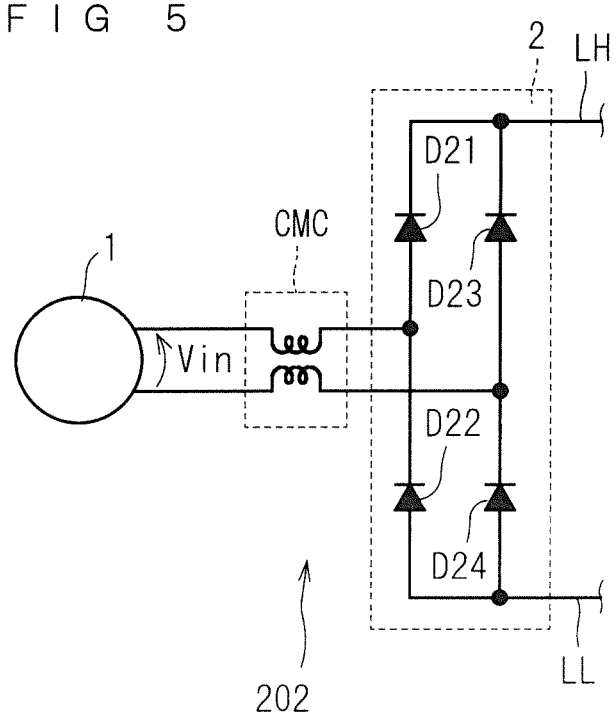

POWER CONVERSION DEVICE AND REFRIGERATION APPARATUS

TECHNICAL FIELD

The present invention relates to a power conversion device, and particularly to a direct-type power conversion device with a power buffer circuit.

BACKGROUND ART

As a direct-type power conversion device, there has been known a configuration including a converter for performing AC-DC conversion, an inverter for performing DC-AC conversion, a pair of DC power source lines that connects the converter and the inverter, and a power buffer circuit for transferring power between the power buffer circuit and the pair of DC power source lines. The power buffer circuit includes a charging circuit and a discharging circuit.

The discharging circuit includes a capacitor and a switching element. The switching element controls whether to allow discharge from the capacitor to the pair of DC power source lines. The charging circuit includes a reactor and a switching element. The switching element controls whether to store energy in the reactor or charge the capacitor of the discharging circuit with the stored energy. Hereinafter, a direct-type power conversion device having the configuration described above is temporarily referred to as a "power conversion device with a power buffer".

There has also been known a configuration in which, in the power conversion device with a power buffer, a low pass filter is provided between the converter and the pair of DC power source lines. The configuration described above is introduced, for example, in JP 2014-096976 A and JP 2015-084637 A. Compared with a case where the low pass filter is provided on a front stage (AC power source side) of the converter, the configuration in which the low pass filter is provided between the converter and the pair of DC power source lines has an advantage of reducing a rated voltage of the capacitor that forms the low pass filter (see, for example, JP 2014-096976 A).

In addition, there has been known an interleaved power source circuit including a power factor improvement circuit including a reactor, a diode, and a switching element, and a smoothing capacitor. There has also been known a configuration in which a reactor is disposed on an opposite side of a smoothing capacitor across a diode and a switching element that are to be cooled by a refrigerant jacket. The configuration described above is introduced, for example, in JP 2015-121364 A.

Note that JP 2016-073025 A is listed as a prior art document that discloses a common mode choke for subsequent description.

SUMMARY

Problem to be Solved by the Invention

It is true that the technique introduced in JP 2015-121364 A prevents the wiring pattern from becoming complicated in the printed wiring board on which the power factor improvement circuit and the smoothing capacitor are mounted. Moreover, through separate disposition of a low-voltage component group from a high-voltage component group, a low-voltage component is less likely to be adversely affected by a high-voltage component.

However, the reactor included in the power factor improvement circuit and the smoothing capacitor are separated from each other by the switching element included in the power factor improvement circuit. Therefore, if the separation described above is applied to the power conversion device with a power buffer, and the switching element included in the discharging circuit and the switching element included in the charging circuit separate the capacitor included in the discharging circuit from the reactor included in the charging circuit, the wiring pattern may be rather complicated.

Accordingly, an object of the present invention is to simplify a wiring pattern in a power conversion device with a power buffer.

Means to Solve the Problem

A power conversion device according to the present invention includes a converter (2) connected to an AC power source (1) to perform AC-DC conversion, a pair of DC power source lines (LH, LL) connected to an output side of the converter, a charging circuit (41) that includes a first reactor (L4) and a first switch (S1) mutually connected in series between the pair of DC power source lines, receives power from the pair of DC power source lines via the first switch to store energy in the first reactor, and charges a first capacitor (C4) with the energy, a discharging circuit (42) that includes the first capacitor and a second switch (Sc) mutually connected in series between the pair of DC power source lines and applies power to the pair of DC power source lines through a discharge of the first capacitor via the second switch, and an inverter (5) that outputs an AC current (Iu, Iv, Iw) to a load (6) through DC-AC conversion of a first voltage (Vdc) between the pair of DC power source lines.

Then, at a first position (P1) in a first direction (Q1), the converter, the first switch, the second switch, and the inverter are disposed in that order along a second direction (Q2) that is different from the first direction. Moreover, at a second position (P2) that is different from the first position in the first direction, the first reactor and the first capacitor are disposed in that order along the second direction. Furthermore, at least one of a set of the first reactor and the converter, and a set of the first capacitor and the inverter is disposed side by side along the first direction.

Effects of the Invention

A wiring pattern can be easily simplified in a power conversion device with a power buffer.

The objects, features, aspects, and advantages of the present invention will be more apparent from the following detailed description and the accompanying drawings.

BRIEF DESCRIPTION OF DRAWINGS

FIG. 4 is a schematic diagram showing a refrigeration apparatus including the power conversion device according to the embodiment;

FIG. 5 is a circuit diagram partially showing a power conversion device according to a modification of the embodiment.

DESCRIPTION OF EMBODIMENTS

Figure 1:
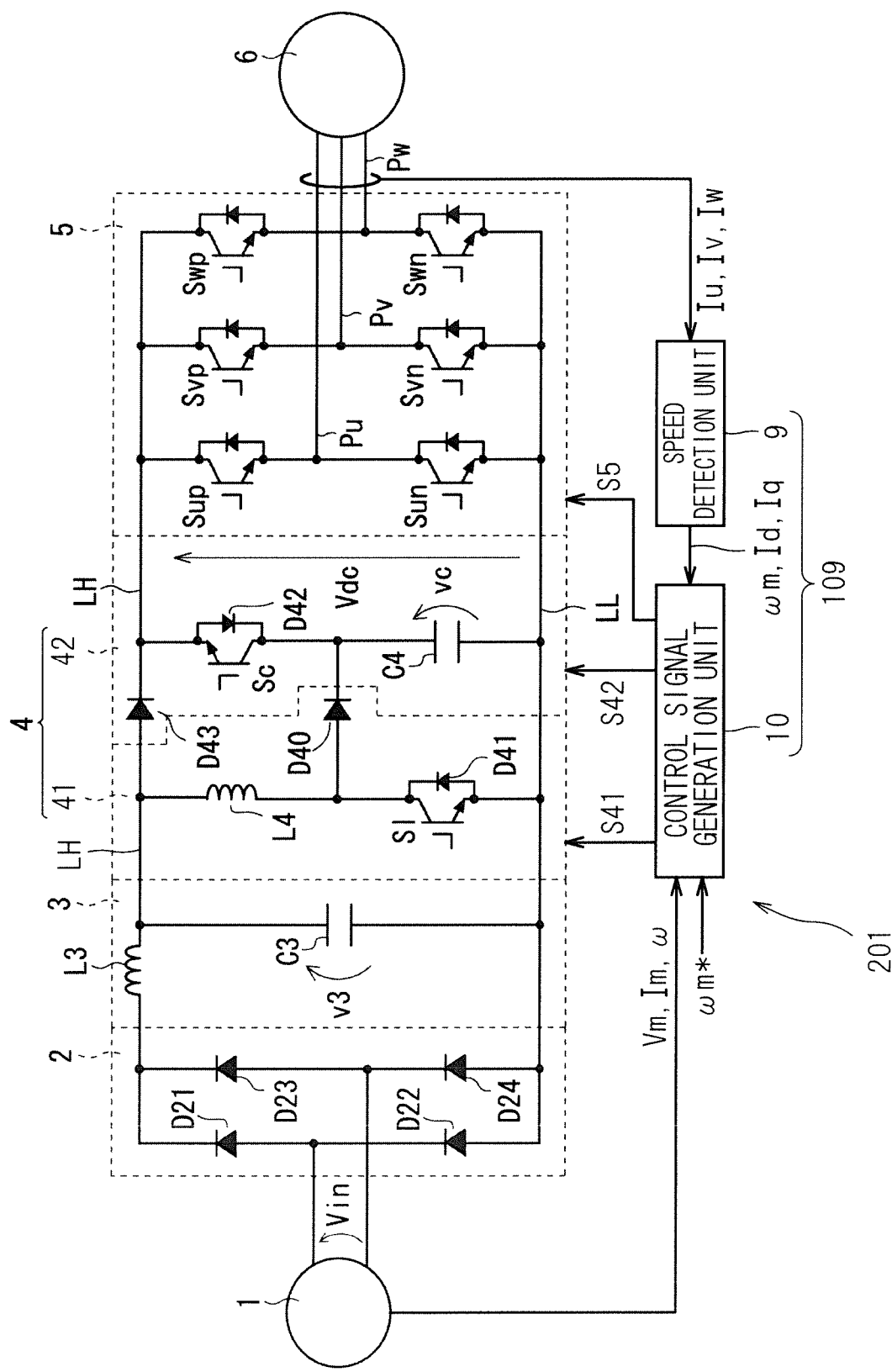
FIG. 1 is a circuit diagram showing a power conversion device according to the embodiment.

FIG. 1 is a circuit diagram showing an electrical configuration and transfer of signals of a power conversion device 201 according to the embodiment. Note that, since a detail of each component of the configuration described above is disclosed in JP 2014-096976 A and JP 2015-084637 A, for example, detailed description is omitted.

In the circuit diagram, the power conversion device 201 includes a converter 2, a pair of DC power source lines LH and LL, a charging circuit 41, a discharging circuit 42, an inverter 5, and a control unit 109. It can be said that the power conversion device 201 is the power conversion device with a power buffer described above.

The converter 2 is connected to an AC power source 1 to perform AC-DC conversion. The pair of DC power source lines LH and LL is connected to an output side of the converter 2.

In FIG. 1, a diode bridge that performs full-wave rectification is shown as the converter 2. Specifically, the converter 2 includes diodes D21, D22, D23, and D24. The AC power source 1 outputs single-phase AC voltage Vin, and the diodes D21 to D24 subject the single-phase AC voltage Vin to single-phase full-wave rectification to convert the single-phase AC voltage Vin into a rectified voltage, and then output the rectified voltage between the pair of DC power source lines LH and LL.

An input side of the converter 2, that is, where the single-phase AC voltage Vin is input, is a pair of a connection point between an anode of the diode D21 and a cathode of the diode D22, and a connection point between an anode of the diode D23 and a cathode of the diode D24.

The output side of the converter 2, that is, where the pair of DC power source lines LH and LL is connected, is a pair of a connection point between a cathode of the diode D21 and a cathode of the diode D23, and a connection point between an anode of the diode D22 and an anode of the diode D24. Specifically, the DC power source line LH is connected to the former connection point, and the DC power source line LL is connected to the latter connection point. Therefore, a potential higher than that of the DC power source line LL is applied to the DC power source line LH.

The charging circuit 41 includes a reactor L4 and a switch S1. The reactor L4 and the switch S1 are mutually connected in series between the pair of DC power source lines LH and LL. The charging circuit 41 receives power from the pair of DC power source lines LH and LL via the switch S1, and stores energy in the reactor L4. Then, the charging circuit 41 charges a capacitor C4 with the energy stored in the reactor L4.

The switch S1 is realized by, for example, a transistor (here, an insulated gate bipolar transistor (IGBT)).

A diode D41 is connected reversely in parallel to the transistor that configures the switch S1. Here, "connected reversely in parallel" refers to a parallel connection in which forward directions are opposite to each other. Specifically, a forward direction of the transistor that realizes the switch S1 is a direction from the DC power source line LH to the DC power source line LL, and a forward direction of the diode D41 is a direction from the DC power source line LL to the DC power source line LH.

Since the DC power source line LH has a higher potential than the DC power source line LL, basically no current flows in the diode D41. Conduction or non-conduction of the switch S1 therefore depends almost exclusively on conduction or non-conduction of the transistor which realizes the switch S1. Therefore, the transistor and the diode D41 may be collectively regarded as the switch S1.

The charging circuit 41 further includes a diode D40. The diode D40 includes a cathode and an anode, and a charging current flows in the diode D40 to charge the capacitor C4. The cathode of the diode D40 is connected to the capacitor C4.

The reactor L4 is connected between the DC power source line LH and the anode of the diode D40. The switch S1 is connected between the DC power source line LL and the anode of the diode D40. The configuration described above is known as a so-called boost chopper.

The discharging circuit 42 includes the capacitor C4 and a switch Sc. The capacitor C4 and the switch Sc are mutually connected in series between the pair of DC power source lines LH and LL. Discharge of the capacitor C4 via the switch Sc causes the discharging circuit 42 to apply power to the pair of DC power source lines LH and LL.

The switch Sc is realized by, for example, a transistor (here, an IGBT). The diode D42 is connected reversely in parallel to the transistor that configures the switch Sc. A forward direction of the transistor that realizes the switch Sc is a direction from the DC power source line LL to the DC power source line LH, and a forward direction of the diode D42 is a direction from the DC power source line LH to the DC power source line LL.

Since a voltage vc supported by the capacitor C4 is boosted by the charging circuit 41, basically no current flows in the diode D42. Conduction or non-conduction of the switch Sc therefore depends exclusively on conduction or non-conduction of the transistor which realizes the switch Sc. Therefore, the transistor and the diode D42 may be collectively regarded as the switch Sc.

The charging circuit 41 and the discharging circuit 42 configure a power buffer circuit 4 for transferring power between the pair of DC power source lines LH and LL.

The inverter 5 inputs a voltage Vdc that is output from the power buffer circuit 4 to the pair of DC power source lines LH and LL, performs DC-AC conversion on the voltage Vdc, and outputs an AC current to a load 6. For example, the load 6 is a three-phase inductive load, and the inverter 5 outputs AC currents Iu, Iv, and Iw.

The inverter 5 includes output terminals Pu, Pv, and Pw, and outputs the AC currents Iu, Iv, and Iw therefrom. The inverter 5 includes six switching elements Sup, Svp, Swp, Sun, Svn, and Swn. For example, IGBTs are adopted as the switching elements Sup, Svp, Swp, Sun, Svn, and Swn.

The switching elements Sup, Svp, and Swp are respectively connected between the output terminals Pu, Pv, and Pw and the DC power source line LH, and the switching elements Sun, Svn, and Swn are respectively connected between the output terminals Pu, Pv, and Pw and the DC power source line LL. The inverter 5 configures a so-called voltage source inverter and includes six diodes.

All of the diodes described above have cathodes directed to the DC power source line LH side and anodes directed to the DC power source line LL side, and are connected reversely in parallel to the switching elements Sup, Svp, Swp, Sun, Svn, and Swn, respectively.

The control unit 109 includes a speed detection unit 9 and a control signal generation unit 10. For example, the load 6 is a compressor that compresses a refrigerant, the speed detection unit 9 detects the AC currents Iu, Iv, and Iw, and gives a rotational angular velocity ωm of the compressor obtained therefrom, and a q axis current Iq and a d axis current Id to the control signal generation unit 10.

The control signal generation unit 10 further inputs amplitude Vm of the single-phase AC voltage Vin, amplitude Im and an electrical angular velocity ω of a current that flows into the converter 2, and a command value ωm* of the rotational angular velocity ωm, and outputs switch control signals S41 and S42 for controlling the switches S1 and Sc, respectively, and an inverter control signal S5 for controlling the inverter 5.

FIG. 1 shows a configuration in which the power conversion device 201 also includes, although not necessary, a low pass filter 3. The low pass filter 3 is interposed between the output side of the converter 2 and the pair of DC power source lines LH and LL. The low pass filter 3 includes a capacitor C3 and a reactor L3. The low pass filter 3 transmits, to the pair of DC power source lines LH and LL, a voltage v3 obtained through filtration of the output voltage of the converter 2. However, rather than having a smoothing function, the low pass filter 3 has a function of preventing noise from the inverter 5 from being transmitted to a side of the AC power source 1.

The voltage v3 is supported by the capacitor C3. It can be said that the charging circuit 41 boosts the voltage v3 to apply a voltage vc to the capacitor C4.

In this manner, in a case where the low pass filter 3 is provided, the discharging circuit 42 further includes a current blocking element D43 in order to prevent discharge from the capacitor C4 to the capacitor C3 through conduction of the switch Sc. Specifically, the current blocking element D43 is provided on the DC power source line LH or the DC power source line LL between the capacitors C3 and C4. The current blocking element D43 is realized by, for example, a diode. In the example of FIG. 1, the diode is provided on the DC power source line LH, and the forward direction thereof is a direction from the converter 2 to the inverter 5.

Figure 2:
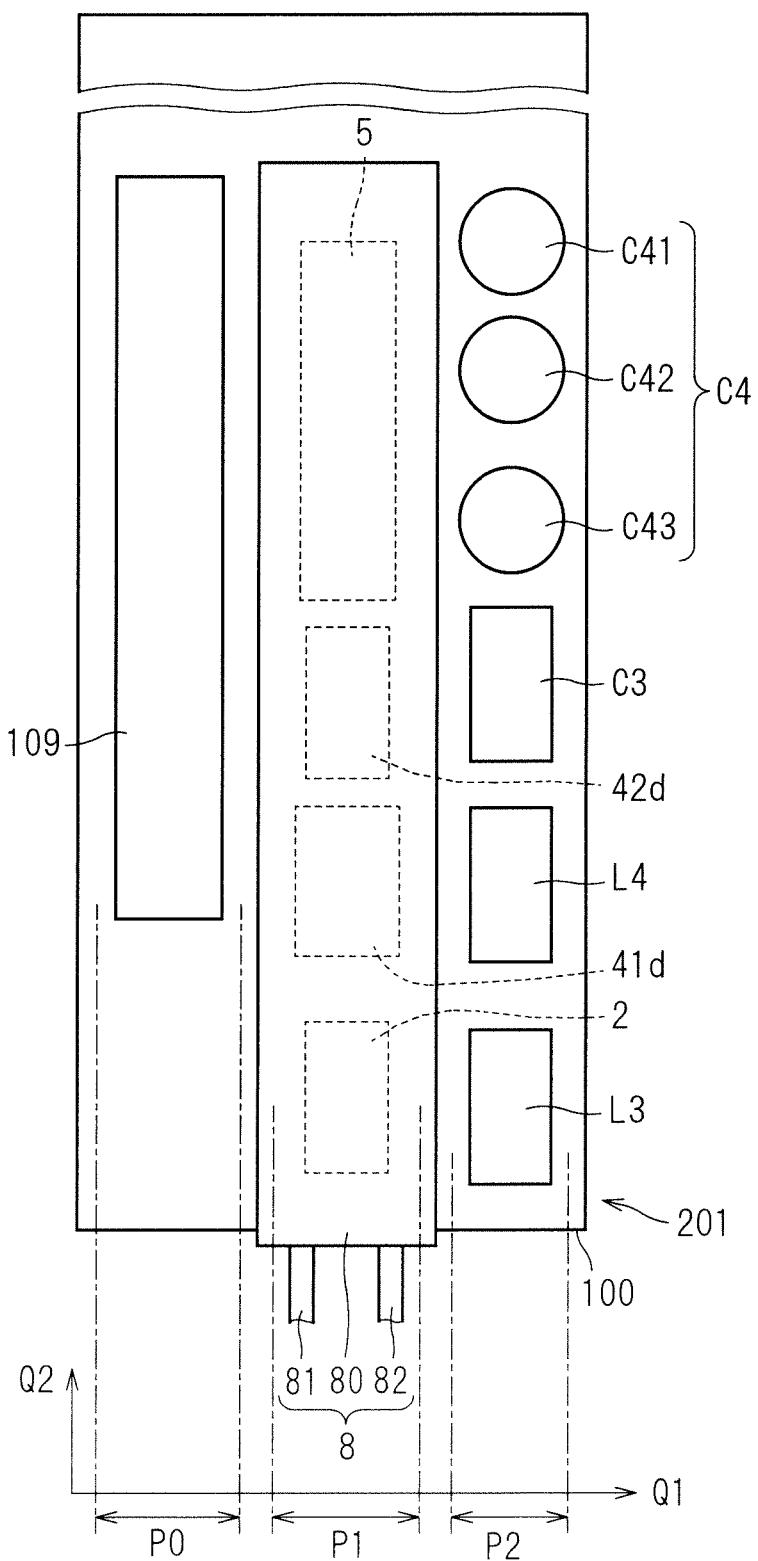
FIG. 2 is a plan view showing the power conversion device according to the embodiment.
Figure 3:
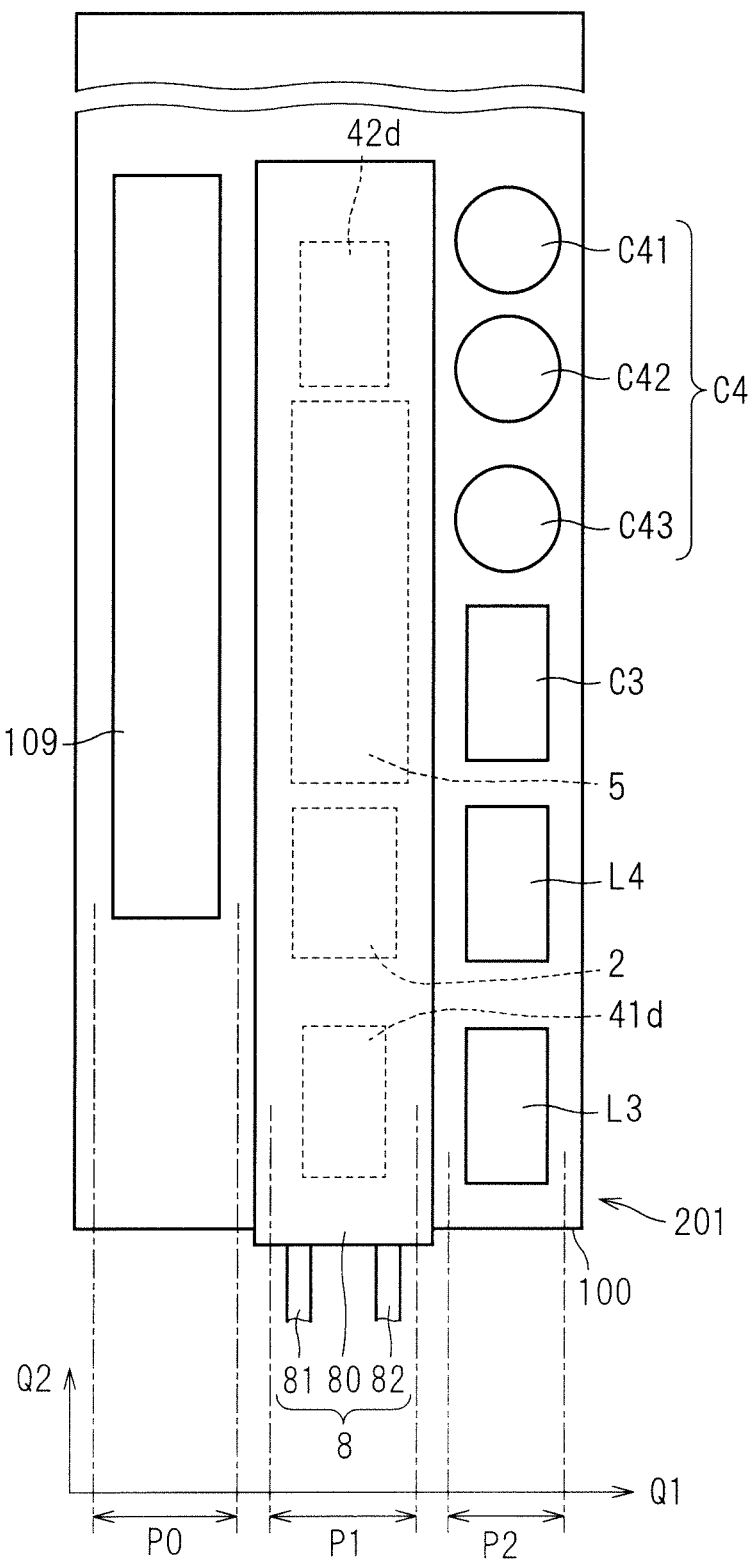
FIG. 3 is a plan view showing the power conversion device according to the embodiment.

FIGS. 2 and 3 are plan views schematically showing spatial disposition of each part in the configuration of the power conversion device 201. The power conversion device 201 is disposed on a substrate 100, and FIG. 2 is a plan view as seen along a thickness direction of the substrate 100. The substrate 100 extends along a first direction Q1 and a second direction Q2 (here, a direction orthogonal to the first direction Q1) that are different from each other.

In FIGS. 2 and 3, for simplicity, description of wiring that connects each element included in the power conversion device 201 is omitted. For example, in FIGS. 2 and 3, the pair of DC power source lines LH and LL is omitted.

At a first position P1 in the first direction Q1, the converter 2, the switch S1, the switch Sc, and the inverter 5 are disposed in that order along the second direction Q2. However, in FIGS. 2 and 3, a set 41d includes the switch S1 and the diode D40, and a set 42d includes the switch Sc and the current blocking element D43 on the assumption that the current blocking element D43 is provided. That is, FIG. 2 shows a case where the converter 2, the sets 41d and 42d, and the inverter 5 are disposed in that order along the second direction Q2.

In the configuration, the power conversion device 201 further includes a cooler 8, which is not described in FIG. 1, in addition to the components described in FIG. 1. The cooler 8 extends along the second direction Q2 at the first position P1 in the first direction Q1, and cools at least the inverter 5 and, further in the examples of FIGS. 2 and 3, the converter 2 and the sets 41d and 42d.

The capacitor C4 includes three capacitors C41, C42, and C43. The capacitors C41, C42, and C43, the capacitor C3, and the reactors L3 and L4 are disposed along the second direction Q2 at a second position P2, which is different from the first position P1, in the first direction Q1. Specifically, the reactor L4 and the capacitor C4 are disposed in that order along the second direction Q2. Although specific disposition of the capacitor C3 and the reactor L3 will be described later, FIG. 2 shows a case where the reactors L3 and L4 and the capacitors C3 and C4 are disposed in that order along the second direction Q2.

In the power conversion device 201, at least one of a set of the reactor L4 and the converter 2 and a set of the capacitor C4 and the inverter 5 is disposed side by side along the first direction Q1.

The disposition described above facilitates simplification of the wiring pattern in the power conversion device with a power buffer. Specifically, in the example shown in FIG. 2, the set of the reactor L4 and the converter 2 is not disposed side by side along the first direction Q1, but the reactor L4 is disposed side by side with the set 41d (including the switch S1). It is obvious that the disposition described above facilitates simplification of the wiring pattern that configures the charging circuit 41.

On the other hand, the set of the capacitor C4 and the inverter 5 is disposed side by side along the first direction Q1. With reference to FIG. 1, in view of the fact that the output side of the discharging circuit 42 including the capacitor C4 is connected to the input side of the inverter 5, it is obvious that the disposition described above facilitates simplification of the wiring pattern provided between the discharging circuit 42 and the inverter 5.

FIG. 3 shows a case where the set of the reactor L4 and the converter 2 is disposed side by side along the first direction Q1. In this case, in view of the fact that the input side of the charging circuit 41 including the reactor L4 is connected to the output side of the converter 2, even with the low pass filter 3 interposed therebetween when the low pass filter 3 is provided, it is obvious that the disposition described above facilitates simplification of the wiring pattern provided between the charging circuit 41 and the converter 2.

As shown in FIG. 3, the capacitor C4 may be disposed side by side with the set 42d (including the switch Sc) along the first direction Q1. It is obvious that the disposition described above facilitates simplification of the wiring pattern that configures the discharging circuit 42.

Note that the diode D40 included in the charging circuit 41 is included in the set 41d as described above. Moreover, the switch Sc included in the discharging circuit 42 is included in the set 42d. Therefore, it can be said that the diode D40 is disposed between the converter 2 and the switch Sc along the second direction Q2 at the first position P1.

In addition, when the low pass filter 3 is provided, the discharging circuit 42 desirably includes the current blocking element D43 as described above. The current blocking element D43 is included in the set 42d as described above. Moreover, the switch S1 included in the charging circuit 41 is included in the set 41d. Therefore, it can be said that the current blocking element D43 is disposed between the switch S1 and the inverter 5 along the second direction Q2 at the first position P1.

As described thus far, it is obvious that combining the diode D40 with the switch S1 in the set 41d and the current blocking element D43 with the switch Sc in the set 42d also facilitates simplification of the wiring pattern.

Further, when the low pass filter 3 is provided, the capacitor C3 and the reactor L3 thereof are desirably disposed along the second direction Q2 at the second position P2 while sandwiching the reactor L4. FIGS. 2 and 3 show a case where the reactors L3 and L4 and the capacitor C3 are disposed in that order along the second direction Q2. This disposition is given in consideration of the fact that an amount of heat radiation of the capacitor C4 and the reactor L4, which store energy, is larger than that of the capacitor C3 and the reactor L3. Since the capacitor C3 and the reactor L3 sandwich the reactor L4, the capacitor C4 and the reactor L4 each having a large amount of heat radiation are prevented from being adjacent to each other, thereby preventing deterioration of the capacitor C4 (or of the reactor L4 as well) due to heat generation.

However, rather than the capacitor C3 and the reactors L4 and L3 being disposed in that order along the second direction Q2, it is desirable, as shown in FIGS. 2 and 3, that the reactors L3 and L4 and the capacitor C3 be disposed in that order. That is, the capacitor C3 is desirably disposed between the reactor L4 and the capacitor C4 along the second direction Q2 at the second position P2. This is because the reactor L3 is connected on a side closer to the converter 2 than the capacitor C3 is (see also FIG. 1), the wiring pattern can be easily simplified.

The control unit 109 is disposed at a third position P0 opposite to the second position P2 with respect to the first position P1. That is, the control unit 109 is disposed on the opposite side of the capacitor C4 and the reactor L4, or further of the capacitor C3 and the reactor L3 across the cooler 8. In the examples of FIGS. 2 and 3, the control unit 109, the cooler 8, the capacitor C4, and the reactor L4 are disposed in that order along the first direction Q1.

The control unit 109 is disposed at the third position P0, the capacitor C4 and the reactor L4, or further the capacitor C3 and the reactor L3 are disposed at the second position P2, and the cooler 8 is disposed at the first position P1. By adopting such disposition, the power conversion device 201 has the cooler 8 between the reactor L4 of the charging circuit 41 and the capacitor C4 of the discharging circuit 42, and the control unit 109. Therefore, the cooler 8 can reduce an influence of the heat radiation from the reactor L4 and the capacitor C4 on the control unit 109. In addition, since the inverter 5 is cooled by the cooler 8, an influence of the heat radiation from the inverter 5 on the control unit 109 can also be reduced.

The cooler 8 has a cooling jacket 80 and inflow and outflow pipes 81 and 82. The inflow and outflow pipes 81 and 82 guide inflow and outflow of the refrigerant to and from the cooling jacket 80.

FIG. 4 is a schematic diagram showing a configuration of a refrigeration apparatus 300 including the power conversion device 201 and the load 6. In FIG. 4, the internal configuration of the power conversion device 201 is omitted except for the cooler 8. The load 6 included in the refrigeration apparatus 300 is a compressor that includes a motor 61 and a compression element 62. The compression element 62 is driven by the motor 61 to compress a refrigerant M. Refrigerant paths B1 and B2 are connected to the compression element 62, and refrigerant paths B4 and B3 are connected to the inflow and outflow pipes 81 and 82, respectively. The refrigeration apparatus 300 configures a heat pump unit.

The refrigerant M flows into the compression element 62 through the refrigerant path B1, and flows out of the compression element 62 through the refrigerant path B2. The refrigerant M flows into the cooling jacket 80 through the refrigerant path B4 and the inflow and outflow pipe 81, and flows out of the cooling jacket 80 through the inflow and outflow pipe 82 and the refrigerant path B3.

For example, heat exchangers such as an evaporator and a condenser, and an expander may be provided between the refrigerant paths B1 and B2 and the refrigerant paths B3 and B4. FIG. 4 shows a case where the refrigerant path B2, a condenser, an expander, and the refrigerant path B4 are connected in that order and the refrigerant M flows in that order, while the refrigerant path B3, an evaporator, and the refrigerant path B1 are connected in that order and the refrigerant M flows in that order.

FIG. 5 is a circuit diagram partially showing an electrical configuration of a power conversion device 202 according to a modification of the embodiment. The power conversion device 202 has a configuration in which a common mode choke CMC is added to the power conversion device 201. The common mode choke CMC is interposed between an AC power source 1 and a converter 2 (see, for example, JP 2016-073025 A). That is, the configuration of the power conversion device 202 on a side electrically closer to an inverter 5 from the converter 2 is the same as that of the power conversion device 201. Therefore, in FIG. 5, the diagram of the configuration on the side closer to the inverter 5 from the converter 2 is omitted.

Figure 6:
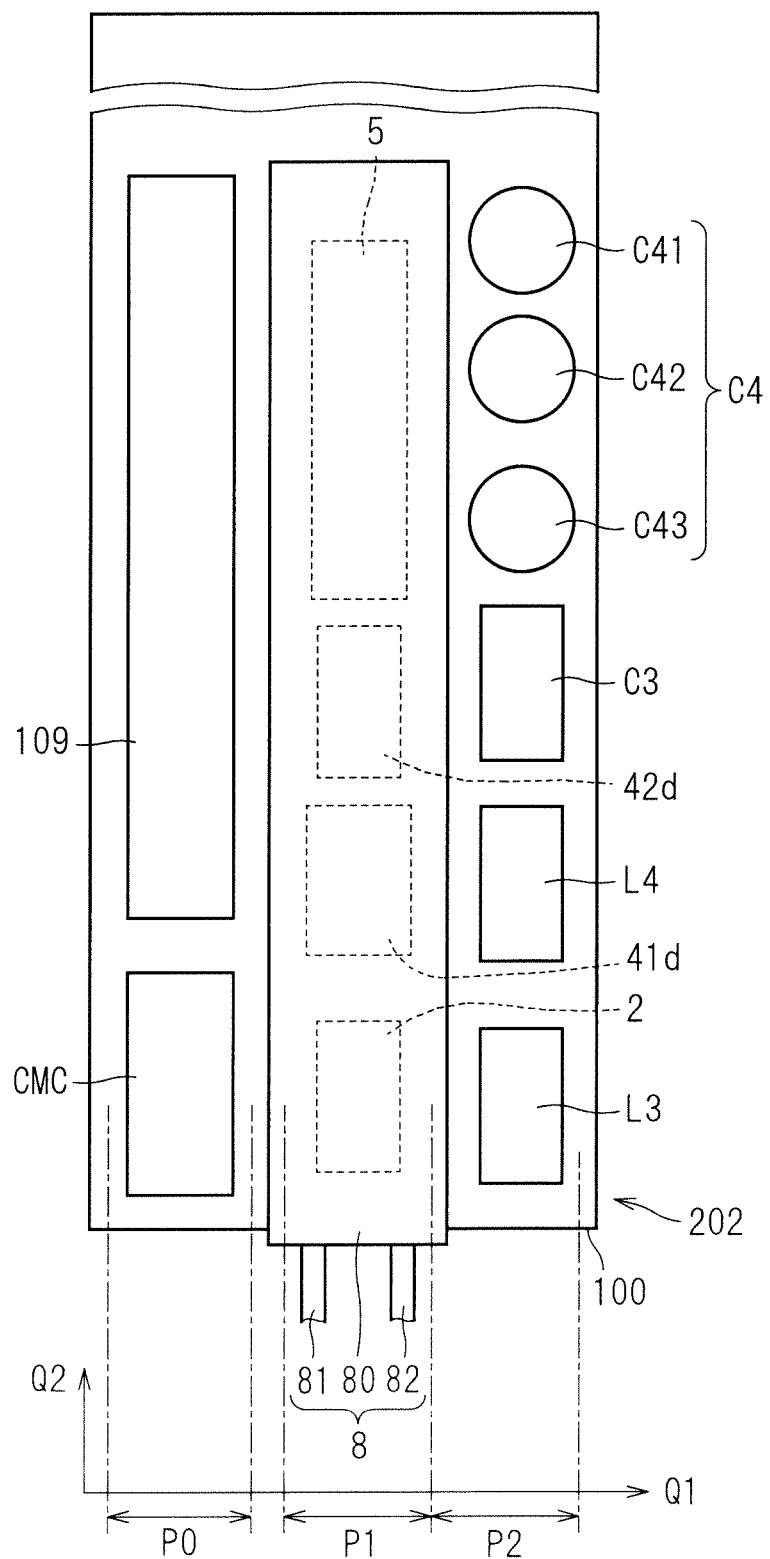
FIG. 6 is a plan view showing the power conversion device according to the modification of the embodiment.

FIG. 6 is a plan view schematically showing spatial disposition of each part in the configuration of the power conversion device 202. Except for the disposition of the common mode choke CMC, the spatial disposition of the power conversion device 202 is the same as the spatial disposition of the power conversion device 201.

The common mode choke CMC is disposed at a third position P0. In the example of FIG. 6, the common mode choke CMC and a control unit 109 are disposed in that order along a second direction Q2. Moreover, in the example of FIG. 6, the common mode choke CMC, a cooler 8, and a reactor L3 are disposed in that order along a first direction Q1.

The common mode choke CMC has a lower amount of heat radiation than the inverter 5, sets 41d and 42d, a capacitor C3, and a reactor L4. Therefore, even if the common mode choke CMC and the control unit 109 are disposed at the third position P0, which is the same side with respect to the cooler 8, the control unit 109 is not heavily affected by the heat generation from the common mode choke CMC.

In addition, the common mode choke CMC is interposed between the AC power source 1 and the converter 2. Therefore, it is obvious that the disposition along the first direction Q1 side by side with the converter 2 facilitates simplification of the wiring pattern.

Of course, in the same manner as the power conversion device 201 shown in FIG. 4, the refrigeration apparatus 300 including the power conversion device 202 can be configured.

Although the present invention has been described in detail, the above description is illustrative in all aspects, and the present invention is not limited to the above description. It is understood that countless variations not illustrated are conceivable without departing from the scope of the present invention.

The invention claimed is:
1. A power conversion device comprising:
   a substrate extending along a first direction and extending along a second direction that is different from the first direction;

a converter connected to an AC power source to perform AC-DC conversion;

a pair of DC power source lines connected to an output side of the converter;

a charging circuit that includes a first reactor and a first switch mutually connected in series between the pair of DC power source lines, receives power from the pair of DC power source lines via the first switch to store energy in the first reactor, and charges a first capacitor with the energy;

a discharging circuit that includes the first capacitor and a second switch mutually connected in series between the pair of DC power source lines, and applies power to the pair of DC power source lines through a discharge of the first capacitor via the second switch; and an inverter that outputs an AC current to a load through DC-AC conversion of a first voltage between the pair of DC power source lines, wherein at a first position along the first direction on the substrate, the converter, the first switch, the second switch, and the inverter are disposed on the substrate in that order along the second direction, at a second position along the first direction, that is different from the first position, the first reactor and the first capacitor are disposed on the substrate in that order along the second direction, and at least one of a set of the first reactor and the converter, and a set of the first capacitor and the inverter is disposed on the substrate side by side along the first direction.

2. The power conversion device according to claim 1, wherein the first reactor is disposed on the substrate side by side with the converter or the first switch along the first direction, and the first capacitor is disposed on the substrate side by side with the inverter or the second switch along the first direction.

3. The power conversion device according to claim 1, wherein the charging circuit further includes a diode through which a charging current for charging the first capacitor flows, and the diode is disposed on the substrate between the converter and the second switch along the second direction at the first position.

4. The power conversion device according to claim 1, further comprising a low pass filter that is interposed between the output side of the converter and the pair of DC power source lines, includes a second capacitor and a second reactor, and transmits, to the pair of DC power source lines, a second voltage obtained through filtration of an output voltage of the converter, wherein the discharging circuit further includes a current blocking element that blocks a current from the first capacitor to the low pass filter, the current blocking element is disposed on the substrate between the first switch and the inverter along the second direction at the first position, and the second capacitor and the second reactor are disposed on the substrate while sandwiching the first reactor along the second direction at the second position.

5. The power conversion device according to claim 4, wherein the second capacitor is disposed on the substrate between the first reactor and the first capacitor along the second direction at the second position.

6. The power conversion device according to claim 1, further comprising a common mode choke that is interposed between the AC power source and the converter, disposed on the substrate at a third position opposite to the second position with respect to the first position, and disposed on the substrate side by side with the converter along the first direction.

7. The power conversion device according to claim 1, further comprising a cooler that is disposed on the substrate at the first position and cools at least the inverter.

8. A refrigeration apparatus comprising:
the power conversion device according to claim 7; and
the load, wherein the load is a compressor that compresses a refrigerant that flows into the cooler.

* * * * *